United States Patent
Yang et al.

(10) Patent No.: US 7,653,372 B2
(45) Date of Patent: Jan. 26, 2010

(54) COMMUNICATION DEVICE, MIXER AND METHOD THEREOF

(75) Inventors: Wei Yang, Singapore (SG); Ching-Shiun Chiu, Hsinchu (TW)

(73) Assignee: Mediatek Singapore Pte Ltd, Singapore (SG)

( * ) Notice: Subject to any disclaimer, the term of this patent is extended or adjusted under 35 U.S.C. 154(b) by 459 days.

(21) Appl. No.: 11/617,970

(22) Filed: Dec. 29, 2006

(65) Prior Publication Data

US 2008/0160950 A1    Jul. 3, 2008

(51) Int. Cl.
*H04B 1/26* (2006.01)

(52) U.S. Cl. .................... 455/313; 455/315; 455/255; 455/293; 455/114.2; 330/252; 330/254; 330/261

(58) Field of Classification Search .................. 455/313, 455/315, 255, 293, 114.2; 330/252, 254, 330/261
See application file for complete search history.

(56) References Cited

U.S. PATENT DOCUMENTS

| 6,121,819 A | 9/2000 | Traylor |
| 6,292,047 B1 | 9/2001 | Traylor |
| 6,882,223 B2 * | 4/2005 | Hsu et al. .................... 330/252 |
| 7,398,073 B2 * | 7/2008 | Pullela et al. ................ 455/313 |

* cited by examiner

*Primary Examiner*—Sanh D Phu
(74) *Attorney, Agent, or Firm*—Thomas, Kayden, Horstemeyer & Risley

(57) ABSTRACT

An IQ mixer and a method thereof. The IQ mixer comprises a pair of Gilbert cells and a degeneration inductor. Each pair of Gilbert cells comprises a pair of first current generators and a pair of switching networks. The pair of first current generators converts an RF signal pair to currents respectively. The pair of switching networks, coupled to the first current generator, modulates the converted RF signal pair with an oscillation signal pair to generate a mixed signal pair. The degeneration inductor is coupled to all pairs of the first current generators, such that it is shared by the pair of Gilbert cells.

18 Claims, 6 Drawing Sheets

COMMUNICATION DEVICE, MIXER AND METHOD THEREOF

BACKGROUND OF THE INVENTION

1. Field of the Invention

The invention relates to electronic circuits, and in particular to a Gilbert cell mixer and a method thereof.

2. Description of the Related Art

Mixer circuits are commonly employed in telecommunication systems to convert one frequency to another. One frequency conversion technique known as direct conversion is popular. Direct conversion refers to techniques whereby an incoming RF signal is received and converted directly to baseband signals without Intermediate Frequency (IF) components. A current trend is to integrate radio frequency (RF) transceiver functionality onto a single die. It is important to reduce circuit dimension and die size, which results in reduction in manufacturing costs.

FIG. 1 is a circuit schematic of a conventional IQ mixer, comprising Gilbert cells 10a and 10b, each comprising a separate emitter degeneration inductor. IQ Mixer 1 modulates input signals RFin+ and RFin− with oscillation signals LO_I± and LO_Q±. Gilbert cell 10a constitutes cross-coupled differential amplifiers, and BJT transistors 110a and 112a convert input voltage signals RFin+ and RFin− respectively to current to feed into a switching network including transistors 102a, 104a, 106a, and 108a. Transistors 102a, 104a, 106a, and 108a mix input signals RFin+ and RFin− with local oscillation signals LO_I+ and LO_I− to produce an in-phase output voltage $V_I$ across intermediate frequency signals IFI+ and IFI−. Similarly, Gilbert cell 10b mixes input signals RFin+ and RFin− with local oscillation signals LO_Q+ and LO_Q− to produce a quadrature output voltage $V_Q$. Employment of separate degeneration inductors $L_a$ and $L_b$ results in large circuit dimensions for conventional IQ mixers.

Thus a need exists for a mixer and method to provide a compact circuit arrangement without affecting circuit performance.

BRIEF SUMMARY OF THE INVENTION

A detailed description is given in the following embodiments with reference to the accompanying drawings.

According to the invention, an IQ mixer comprises a pair of Gilbert cells and a degeneration inductor. Each pair of Gilbert cells comprises a pair of first current generators and a pair of switching networks. The pair of first current generators converts an RF signal pair to currents respectively. The pair of switching networks, coupled to the first current generator, modulates the converted RF signal pair with an oscillation signal pair to generate a mixed signal pair. The degeneration inductor is coupled to all pairs of the first current generators, such that it is shared by the pair of Gilbert cells.

According to another embodiment of the invention, a communication device including an IQ mixer comprises a pair of Gilbert cells and a degeneration inductor. Each pair of Gilbert cells comprises a pair of first current generators and a pair of switching networks. The pair of first current generators converts an RF signal pair to currents respectively. The pair of switching networks, coupled to the first current generator, modulates the converted RF signal pair with an oscillation signal pair to generate a mixed signal pair. The degeneration inductor is coupled to all pairs of the first current generators, such that it is shared by the pair of Gilbert cells.

According to yet another embodiment of the invention, a method for use in a communication device including an IQ mixer comprising a pair of Gilbert cells, each having a pair of first current generators and a pair of switching networks comprises each pair of first current generators converting an RF signal pair to currents respectively, each pair of switching networks modulating the converted RF signal pair with an oscillation signal pair to generate a mixed signal pair, and coupling a degeneration inductor to all pairs of the first current generators, such that it is shared by the pair of Gilbert cells.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
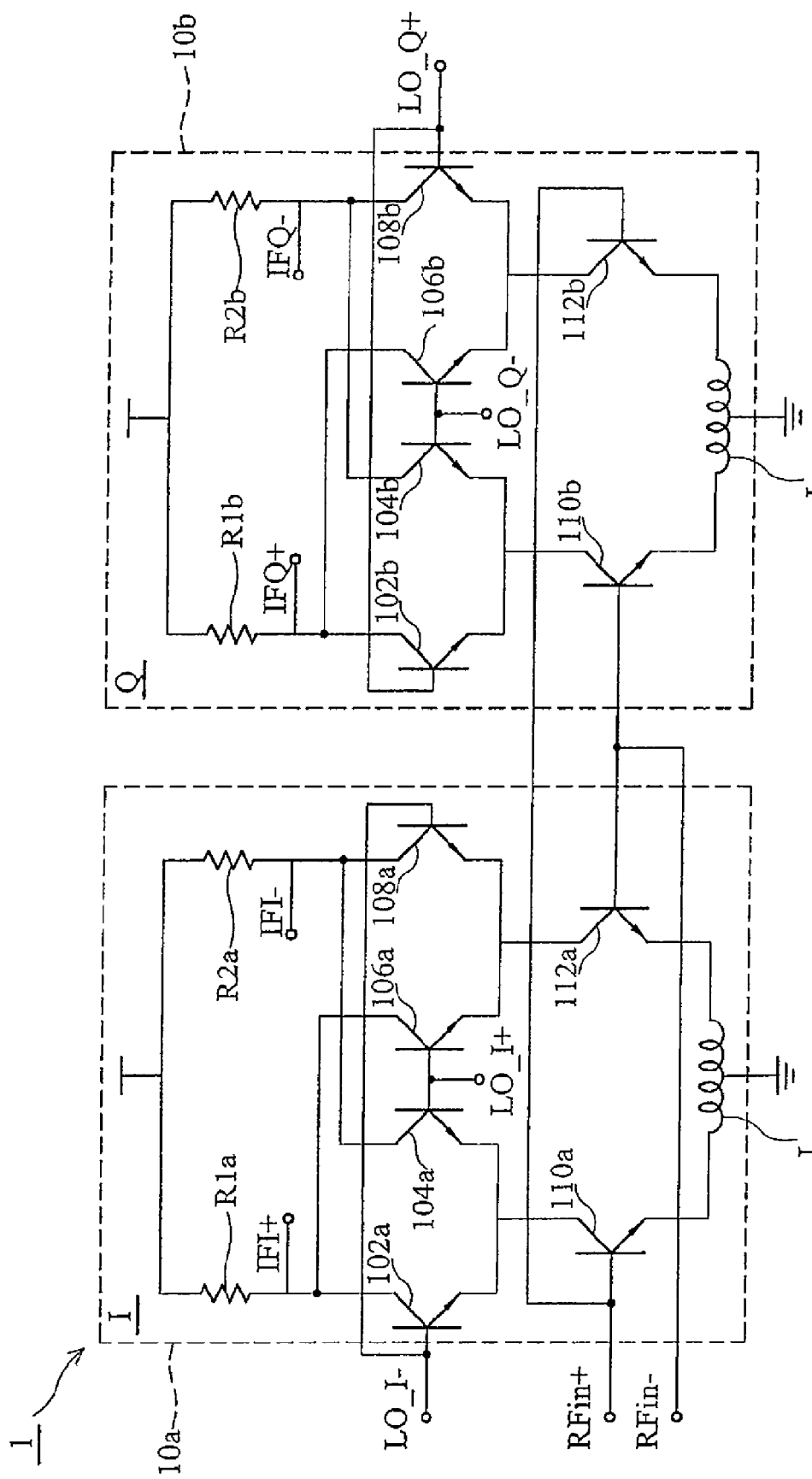
FIG. 1 is a circuit schematic of a conventional IQ mixer.
Figure 2:
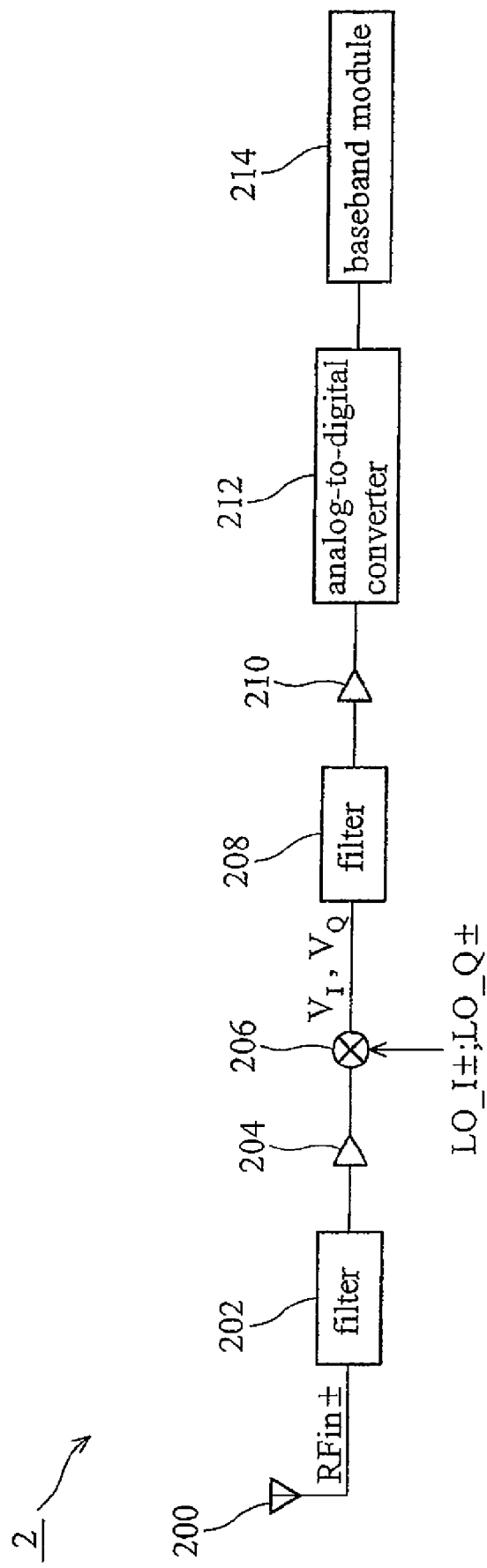
FIG. 2 is a block diagram of an exemplary receiver employing direct conversion according to the invention

FIG. 2 is a block diagram of an exemplary receiver employing direct conversion according to the invention, comprising antenna 200, filter 202, pre-amplifier 204, mixer 206, filter 208, post-amplifier 210, analog-to-digital converter 212, and baseband module 214. Antenna 200 is coupled to filter 202, pre-amplifier 204, mixer 206, filter 208, post-amplifier 210, analog-to-digital converter 212, and subsequently to baseband module 214.

Antenna 200 receives input signal pair RFin±, filtered by filter 202 and amplified by pre-amplifier 204, modulated in mixer 206 with local oscillation signal pairs LO_I± and LO_Q± to produce in-phase and quadrature output voltages $V_I$ and $V_Q$, which in turn are filtered by filter 208 and amplified by post-amplifier 210, converted to digital form in analog-to-digital converter 212, and passed to baseband module 214 to perform subsequent baseband operations. Filter 202 may be a high frequency band pass filter. Mixer 206 may be a Gilbert cell mixer. Filter 208 may be a channel filter selecting a data channel for data processes. Post-amplifier 210 may be a programmable gain amplifier (PGA) changing amplifier gain thereof to amplify the filtered output voltages $V_I$ and $V_Q$, such that analog-to-digital converter 212 receives strong signals for conversion to digital form.

Figure 3:
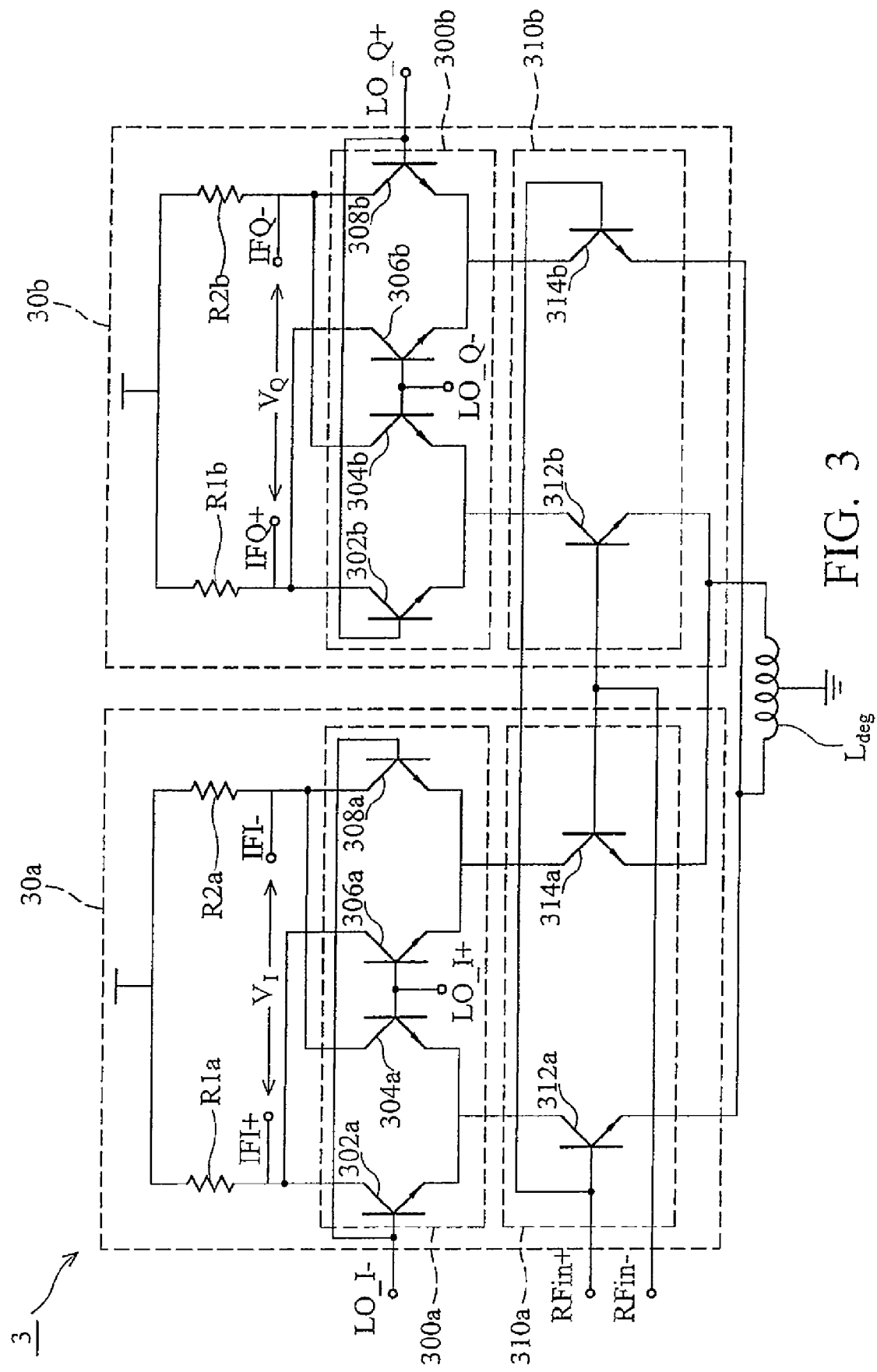
FIG. 3 is a circuit schematic of an exemplary Gilbert cell IQ mixer according to the invention.

FIG. 3 is a circuit schematic of an exemplary Gilbert cell IQ mixer incorporated in FIG. 2, comprising Gilbert cells 30a and 30b, and degeneration inductor $L_{deg}$. Gilbert cells 30a modulates input signal pair RFin+ and RFin− with local oscillation signal pair LO_I+ and LO_I− to establish in-phase output voltage $V_I$ across in-phase IF signal pair IFI+ and IFI−. Likewise, Gilbert cells 30b establish quadrature phase output voltage $V_Q$ across quadrature phase IF signal pair IFQ+ and IFQ−. Degeneration inductor $L_{deg}$ is coupled and shared between Gilbert cells 30a and 30b. Input signals RFin+ and RFin− are a differential pair in Radio Frequency (RF) form. Local oscillation signals LO_I± and LO_Q± comprise in-phase and quadrature components generated by a local oscillator (not shown).

Gilbert cell 30a comprises switching network 300a, current generator 310a, and bias resistors R1a and R2a. Current generator 310a comprises two separate voltage-to-current converters 312a and 314a, converting input signals RFin+ and RFin− from voltage to current form respectively. Each voltage-to-current converter provides high gain and low noise figure, and may be implemented by a BJT transistor or a MOSFET transistor. Switching network 300a modulates the linear current signal pair from converters 310a and 312a with local oscillation signal pair LO_I+ and LO_I−.

Gilbert cell 30b comprises switching network 300b, current generator 310b, and bias resistors R1b and R2b. Gilbert cell 30b utilizes identical circuit implementation as 30a, and modulates input signals RFin+ and RFin− with local oscillation signal pair LO_Q+ and LO_Q− to produce output quadrature voltage $V_Q$. Oscillation signal pair LO_Q+ and LO_Q−, and signal pair LO_I+ and LO_I− differ in-phase by 90°, respectively. Degeneration inductor $L_{deg}$ is shared between current generators 310a and 310b, decreases noise and increases linearity in the voltage-to-current conversion. In comparison to conventional technology, shared degeneration inductor $L_{deg}$ reduces circuit mismatch between in-phase and quadrature components, decreases circuit dimension, and provides a more economic solution in terms of designing and manufacturing cost.

Figure 4:
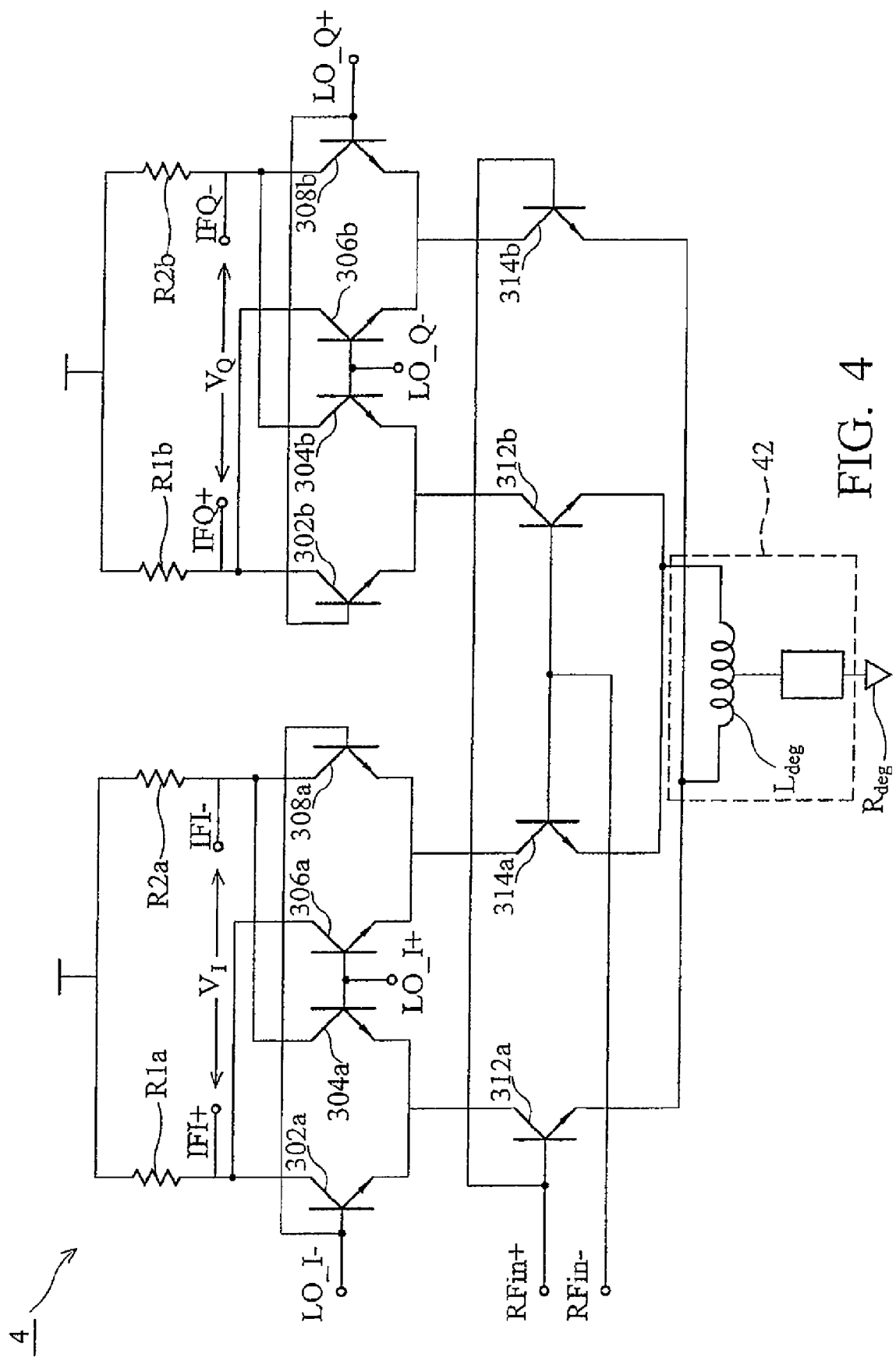
FIG. 4 is a circuit diagram of another exemplary Gilbert cell IQ mixer according to the invention.

FIG. 4 is a circuit diagram of another exemplary Gilbert cell mixer according to the invention. FIG. 4 differs from FIG. 3 in the inclusion of degeneration resistor $R_{deg}$ serially connected to degeneration inductor $L_{deg}$, together providing degeneration device 42 shared between Gilbert cells 30a and 30b. The combination of degeneration resistor $R_{deg}$ and degeneration inductor $L_{deg}$ may be implemented by bonding wire between die of mixer circuit 4 and the ground. In comparison to conventional technology and Gilbert cell mixer 3, Gilbert cell mixer 4 provides better common mode reject, resulting in less noise signal and increased linearity in the voltage-to-current conversion.

Figure 5:
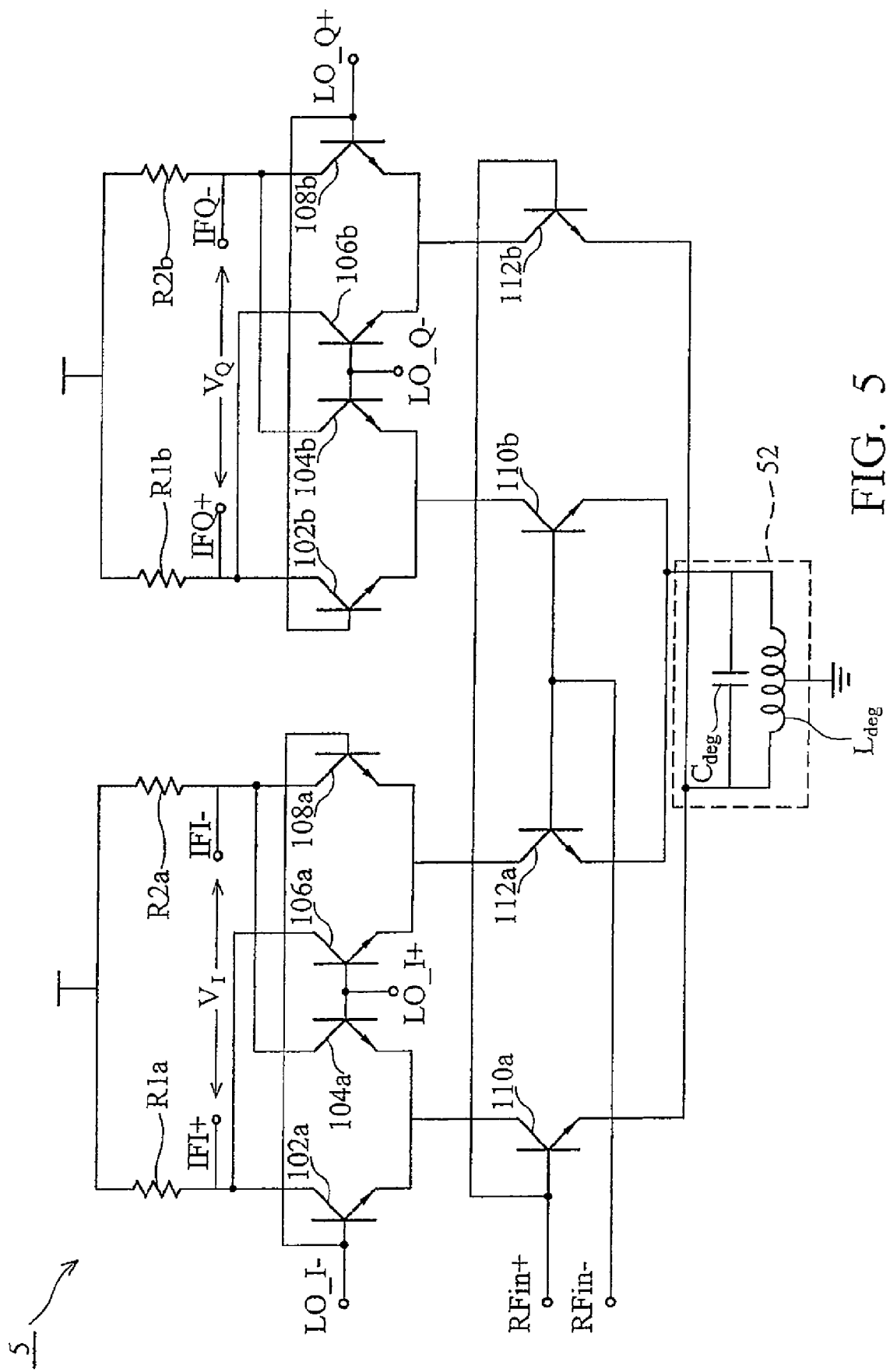
FIG. 5 is a circuit diagram of yet another exemplary Gilbert cell IQ mixer according to the invention.

FIG. 5 is a circuit diagram of yet another exemplary Gilbert cell mixer according to the invention. FIG. 5 differs from FIG. 3 in the inclusion of a degeneration capacitor $C_{deg}$, in parallel to degeneration inductor $L_{deg}$, providing LC tank circuit 52 shared between Gilbert cells 30a and 30b. The values of degeneration capacitor $C_{deg}$ and degeneration inductor $L_{deg}$ are selected such that resonant frequency $f_r$ doubles the frequency of input signal pair RFin±, reducing second order harmonic distortion and further increasing linearity of the circuit conversion. LC tank circuit 52 is particularly useful for multiple frequency bands sharing a common Gilbert cell mixer, since second order spurious products from multiple tone in input signals RFin+ and RFin−, referred to as the second order input intercept point, are reduced considerably.

Figure 6:
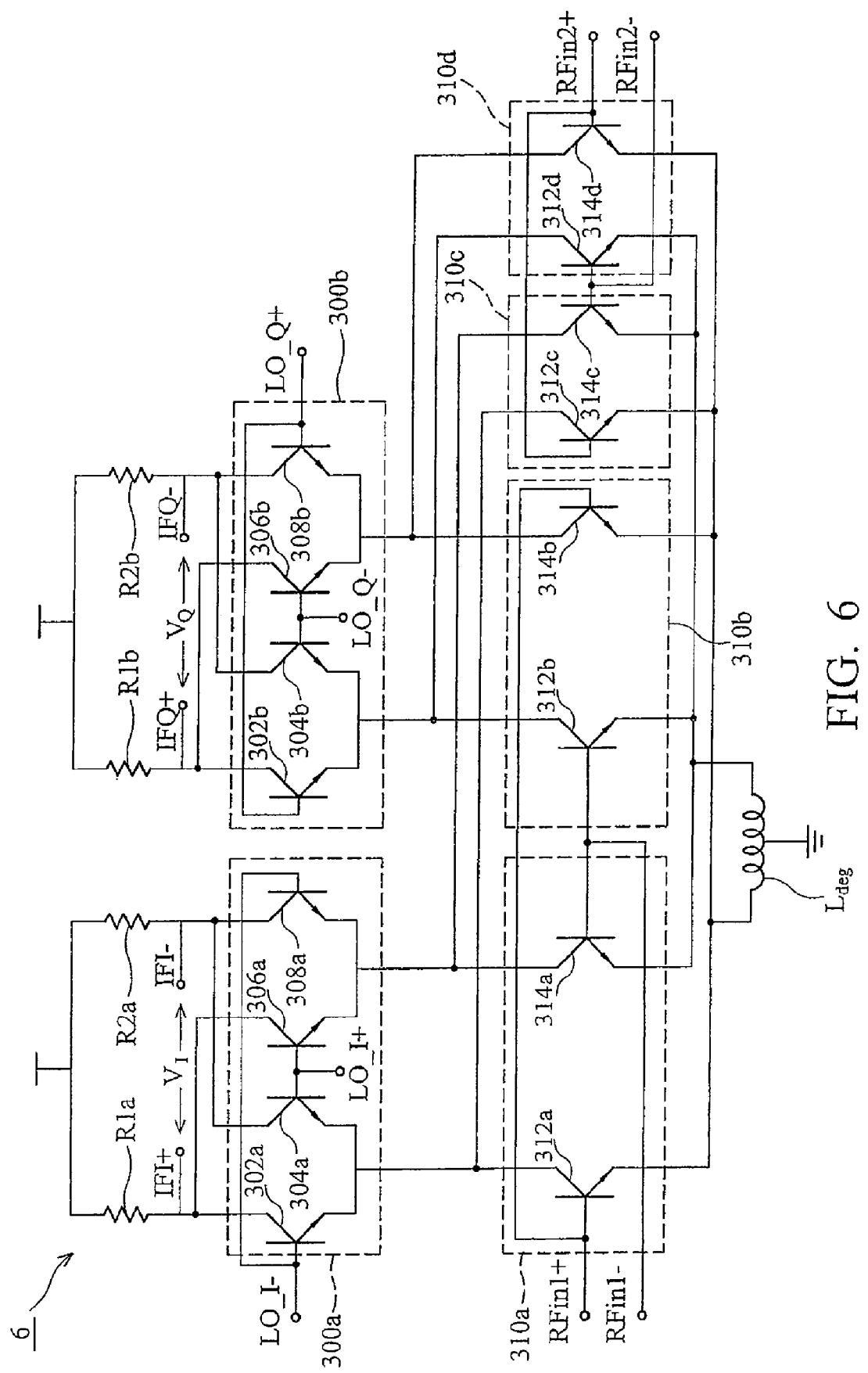
FIG. 6 is a circuit diagram of still another exemplary Gilbert cell IQ mixer according to the invention.

FIG. 6 is a circuit diagram of still another exemplary Gilbert cell mixer according to the invention, further including current generators 310c and 310d on the top of the Gilbert cell mixer in FIG. 3. Gilbert cell mixer 6 can perform dual-band modulation. Current generator 310c is coupled in parallel with 310a and in series with switching network 300a, and current generator 310d in parallel with 310b and in series with switching network 300b. Current generators 310c and 310d receive second input signal pair RFin2± occupying different frequency band from first input signal pair RFin1±. For example, first input signal pair RFin1± may occupy frequency band for Global System for Mobile communications (GSM) approximately at 850 or 900 MHz, and second input signal pair RFin2± may be occupy frequency band for Digital Cellular System (DCS) approximately at 1800 MHz or Personal Communication system (PCS) approximately at 1900 MHz. During GSM signal reception, the local oscillator (not shown) generates local oscillation signal pairs LO_I± and LO_Q± corresponding to GSM carrier frequency at 850 or 900 MHz, and Gilbert cell mixer 6 demodulates first input signal pair RFin1± thereby to produce demodulated GSM signals $V_I$ and $V_Q$. In DCS or PCS applications, local oscillation signal pairs LO_I± and LO_Q± corresponding to DCS and PCS carrier frequency at 1800 or 1900 MHz, and Gilbert cell mixer 6 demodulates second input signal pair RFin2± thereby to produce demodulated DCS or PCS signals $V_I$ and $V_Q$. Mixer 6 may include multiple current generators to perform multiple-band modulation in the design principle provided hereby.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An IQ mixer, comprising:
   a pair of Gilbert cells, each comprising
      a pair of first current generators, converting an RF signal pair to currents respectively, and
      a pair of switching networks, coupled to the first current generator, modulating the converted RF signal pair with an oscillation signal pair to generate a mixed signal pair; and
   a degeneration inductor, coupled to all pairs of the first current generators, such that it is shared by the pair of Gilbert cells; and
   a degeneration resistor coupled to the degeneration inductor.

2. An IQ mixer, comprising:
   a pair of Gilbert cells, each comprising
      a pair of first current generators, converting an RF signal pair to currents respectively, and
      a pair of switching networks, coupled to the first current generator, modulating the converted RF signal pair with an oscillation signal pair to generate a mixed signal pair; and
   a degeneration inductor, coupled to all pairs of the first current generators, such that it is shared by the pair of Gilbert cells; and
   a degeneration capacitor coupled to the degeneration inductor.

3. The mixer of claim 1, further comprising two pairs of second current generators in parallel with the two pairs of first current generators, converting a second RF signal pair to currents respectively, the switching network further modulating the converted second RF signal pair with an second oscillation signal pair to generate a second mixed signal pair.

4. The mixer of claim 1, wherein the mixed signal pair comprises an in-phase signal and a quadrature signal.

5. The mixer of claim 1, wherein the RF signal pair and the oscillation signal pair are differential signal pairs.

6. The mixer of claim 1, wherein the current generators comprises MOS transistors.

7. The mixer of claim 1, wherein the current generators comprises BJT transistors.

8. A communication device including an IQ mixer, comprising:
a pair of Gilbert cells, each comprising
a pair of first current generators, converting an RF signal pair to currents respectively, and
a pair of switching networks, coupled to the first current generator, modulating the converted RF signal pair with an oscillation signal pair to generate a mixed signal pair; and
a degeneration inductor, coupled to all pairs of the first current generators, such that it is shared by the pair of Gilbert cells; and
a degeneration capacitor coupled to the degeneration inductor.

9. A communication device including an IQ mixer, comprising:
a pair of Gilbert cells, each comprising
a pair of first current generators, converting an RF signal pair to currents respectively, and
a pair of switching networks, coupled to the first current generator, modulating the converted RF signal pair with an oscillation signal pair to generate a mixed signal pair; and
a degeneration inductor, coupled to all pairs of the first current generators, such that it is shared by the pair of Gilbert cells; and
a degeneration resistor coupled to the degeneration inductor.

10. The communication device of claim 8, further comprising two pairs of second current generators in parallel with the two pairs of first current generators, converting a second RF signal pair to currents respectively, the switching network further modulating the converted second RF signal pair with a second oscillation signal pair to generate a second mixed signal pair.

11. A method for use in a communication device including a mixer comprising a pair of Gilbert cells, each having a pair of first current generators and a pair of switching networks, the method comprising:
each pair of first current generators converting an RF signal pair to currents respectively,
each pair of switching networks modulating the converted RF signal pair with an oscillation signal pair to generate a mixed signal pair;
coupling a degeneration inductor to all pairs of the first current generators, such that it is shared by the pair of Gilbert cells;
coupling a degeneration resistor to the degeneration inductor; and
coupling a degeneration capacitor to the degeneration inductor.

12. The method of claim 11, further comprising:
providing two pairs of second current generators in parallel with the two pairs of first current generators;
each of the second current generator pair converting a second RF signal pair to currents respectively; and
the switching network further modulating the converted second RF signal pair with a second oscillation signal pair to generate a second mixed signal pair.

13. The method of claim 11, wherein the mixed signal pair comprises an in-phase signal and a quadrature signal.

14. The method of claim 11, wherein the RF signal pair and the oscillation signal pair are differential signal pairs.

15. The method of claim 11, wherein the current generators comprises MOS transistors.

16. The method of claim 11, wherein the current generators comprises BJT transistors.

17. The IQ mixer of claim 1, wherein the degeneration resistor is implemented by a bonding wire.

18. The communication device of claim 8, wherein the degeneration resistor is implemented by a bonding wire.

* * * * *